(12) United States Patent
Zhao

(10) Patent No.: US 10,622,441 B2
(45) Date of Patent: Apr. 14, 2020

(54) SEMICONDUCTOR APPARATUS AND MANUFACTURING METHOD FOR SAME

(71) Applicants: Semiconductor Manufacturing International (Shanghai) Corporation, Shanghai (CN); Semiconductor Manufacturing International (Beijing) Corporation, Beijing (CN)

(72) Inventor: Hai Zhao, Shanghai (CN)

(73) Assignees: Semiconductor Manufacturing (Shanghai) International Corporation, Shanghai (CN); Semiconductor Manufacturing (Beijing) International Corporation, Beijing (CN)

(*) Notice: Subject to any disclaimer, the term of this patent is extended or adjusted under 35 U.S.C. 154(b) by 0 days.

(21) Appl. No.: 16/032,810

(22) Filed: Jul. 11, 2018

(65) Prior Publication Data
US 2019/0074353 A1 Mar. 7, 2019

(30) Foreign Application Priority Data
Sep. 1, 2017 (CN) .......................... 2017 1 0776468

(51) Int. Cl.
*H01L 29/06* (2006.01)
*H01L 27/088* (2006.01)
(Continued)

(52) U.S. Cl.
CPC ...... *H01L 29/0649* (2013.01); *H01L 21/0337* (2013.01); *H01L 21/3085* (2013.01);
(Continued)

(58) Field of Classification Search
CPC ............ H01L 21/0337; H01L 21/3085; H01L 21/76229; H01L 29/785; H01L 21/823431;
(Continued)

(56) References Cited

U.S. PATENT DOCUMENTS 10,014,296 B1* 7/2018 Dou .................... H01L 27/0886
2018/0315752 A1* 11/2018 Fan .................... H01L 27/0886

* cited by examiner

*Primary Examiner* — Yosef Gebreyesus
(74) *Attorney, Agent, or Firm* — Brinks Gilson & Lione

(57) ABSTRACT

The present disclosure relates to the field of semiconductor technologies, and discloses semiconductor apparatus and manufacturing methods for the same. In some implementations, a method may include: providing a substrate structure which includes: a substrate, one or more fins located on the substrate and extending along a first direction, and an isolation region located around one of the fins, an upper surface of the isolation region being lower than an upper surface of the fin, the isolation region including a first isolation region and a second isolation region, where the first isolation region is located on a side surface of the fin that is in the first direction, and the second isolation region is located on a side surface of the fin that is in a second direction that is different from the first direction; forming, on the substrate structure, a sacrificial layer having an opening, the opening exposing an upper surface of the first isolation region and exposing a part, which is located above the first isolation region, of the side surfaces of the fin adjacent to the first isolation region; filling the opening with an insulating material to form a third isolation region on the first isolation region, an upper surface of the third isolation region being higher than the upper surface of the fin; and removing the sacrificial layer.

11 Claims, 17 Drawing Sheets

(51) Int. Cl.
  *H01L 29/66* (2006.01)
  *H01L 21/762* (2006.01)
  *H01L 21/8234* (2006.01)
  *H01L 21/033* (2006.01)
  *H01L 21/308* (2006.01)
  *H01L 29/78* (2006.01)

(52) U.S. Cl.
  CPC .. *H01L 21/76224* (2013.01); *H01L 21/76229* (2013.01); *H01L 21/823431* (2013.01); *H01L 27/0886* (2013.01); *H01L 29/66795* (2013.01); *H01L 29/785* (2013.01)

(58) Field of Classification Search
  CPC ........... H01L 21/76224; H01L 29/0649; H01L 29/66795; H01L 27/0886
  See application file for complete search history.

SEMICONDUCTOR APPARATUS AND MANUFACTURING METHOD FOR SAME

RELATED APPLICATIONS

The present application claims priority to Chinese Patent Appln. No. 201710776468.3, filed Sep. 1, 2017, the entire disclosure of which is hereby incorporated by reference.

BACKGROUND

Technical Field

The present application relates to the field of semiconductor technologies, and in particular, to semiconductor apparatus and manufacturing methods for the same.

Related Art

In a Fin Field Effect Transistor (Fin FET), in order to control critical dimension uniformity (CD uniformity), a pseudo-gate structure is usually formed on a shallow trench isolation (STI) region. In addition, in order to improve the performance of Fin FET devices, it is usually necessary to etch an end portion of a fin adjacent to the pseudo-gate structure, so as to form an indentation, and to epitaxially grow a semiconductor material in the indentation to introduce a stress into a channel.

However, in general cases, as the STI region is lower than the fin, the bottom of the pseudo-gate structure on the STI region is lower than the fin. If there is an error in overlay accuracy or process, the pseudo-gate structure formed on the STI region may be deviated, and therefore, the pseudo-gate structure and the fin are also connected, that is, a bridge is formed. This may cause an electric leakage phenomenon, thereby reducing the reliability of a device. In addition, the deviation of the pseudo-gate structure may also affect the contour of the semiconductor material in epitaxial growth, and this may decrease the value of the stress introduced to the channel, thereby reducing carrier mobility of the device and further reducing the performance of the device.

SUMMARY

An objective of the present disclosure is to improve a reliability of a device. Another objective of the present disclosure is to improve carrier mobility of the device.

In one aspect of the present disclosure, a manufacturing method for a semiconductor apparatus is provided. The method may include: providing a substrate structure that includes: a substrate, one or more fins located on the substrate and extending along a first direction and an isolation region located around the fin, where an upper surface of the isolation region being lower than an upper surface of a fin, the isolation region including a first isolation region and a second isolation region, the first isolation region being located on a side surface of the fine that is in the first direction, and the second isolation region being located on a side surface of the fin that is in a second direction that is different from the first direction; forming, on the substrate structure, a sacrificial layer having an opening, the opening exposing an upper surface of the first isolation region and exposing a part, which is located above the first isolation region, of the side surface of the fin adjacent to the first isolation region; filling the opening with an insulating material to form a third isolation region on the first isolation region, an upper surface of the third isolation region being higher than the upper surface of the fin; and removing the sacrificial layer.

In some implementations, the opening further exposes an end portion of the fin adjacent to the first isolation region, and the third isolation region covers the end portion.

In some implementations, forming, on the substrate structure, a sacrificial layer having an opening includes: forming a sacrificial material layer above the substrate structure; forming a patterned mask layer above the sacrificial material layer; etching the sacrificial material layer using the mask layer as a mask, to form a first opening that exposes the upper surface of the first isolation region; removing the mask layer; and performing wet etching to expand the first opening to be the opening, so that the part, which is located above the first isolation region, of the side surface of the fin adjacent to the first isolation region is exposed, where the remaining sacrificial material layer is used as the sacrificial layer.

In some implementations, forming a sacrificial material layer above the substrate structure includes: forming a protection layer on the substrate structure; and forming the sacrificial material layer on the protection layer; wherein the method further includes: removing the protection layer under the sacrificial layer after removing the sacrificial layer.

In some implementations, filling the opening with an insulating material includes: after forming the sacrificial layer, forming an insulating material covering the substrate structure, so as to fill the opening; and flattening the insulating material using the sacrificial layer as a stop layer, so that an upper surface of the insulating material in the opening is substantially flush with an upper surface of the sacrificial layer.

In some implementations, the sacrificial layer includes a silicon nitride, a silicon oxynitride or silicon oxycarbide; and the insulating material includes a silicon oxide.

In some implementations, the step of providing a substrate structure includes: providing an initial substrate; forming a patterned hard mask on the initial substrate; etching the initial substrate using the hard mask as a mask, so as to form a substrate and the one or more fins located on the substrate; depositing an isolation material to fill space around the fin, an upper surface of the isolation material being substantially flush with an upper surface of the hard mask; performing first back-etching on the isolation material to expose the hard mask; removing the hard mask; and performing second back-etching on the remaining isolation material to form the substrate structure.

In some implementations, the initial substrate includes an initial semiconductor layer and an initial buffer layer located on the initial semiconductor layer; the fin includes a semiconductor layer and a buffer layer located on the semiconductor layer; and the second back-etching further removes the buffer layer.

In some implementations, the method further includes: forming a first gate structure on the fin and forming a second gate structure on the third isolation region.

In some implementations, the method further includes: etching fins on both sides of the first gate structure using the first gate structure and the second gate structure as masks to form indentations; and epitaxially growing a semiconductor material in the indentations to form a source region and a drain region.

In some implementations, the first gate structure includes a first gate dielectric layer on the surface of the fin, a first gate on the first gate dielectric layer, a first hard mask layer on the first gate, and a first spacer on side walls of the first gate dielectric layer, the first gate and the first hard mask layer; and the second gate structure includes a second gate on the third isolation region, a second hard mask layer on the second gate, and a second spacer on side walls of the second gate and the second hard mask layer, the second spacer covering the end portion of the fin adjacent to the third isolation region.

In another aspect of the present disclosure, a semiconductor apparatus is provided, including: a substrate; one or more fins located on the substrate and extending along a first direction; and an isolation region located around the fin, an upper surface of the isolation region being lower than an upper surface of the fin, the isolation region including: a first isolation region located on a side surface, which is in the first direction, of the fin and a second isolation region located on a side surface, which is in a second direction different from the first direction, of the fin; and a third isolation region located on the first isolation region, an upper surface of the third isolation region being higher than the upper surface of the fin.

In some implementations, the third isolation region covers an end portion of the fin adjacent to the first isolation region.

In some implementations, the apparatus further includes: a protection layer between the third isolation region and the fin.

In some implementations, the apparatus further includes: a first gate structure on the fin and a second gate structure on the third isolation region.

In some implementations, the apparatus further includes: a source region and a drain region that are formed by means of epitaxial growth of a semiconductor material on both sides of the first gate structure.

In some implementations, the first gate structure includes a first gate dielectric layer on the surface of the fin, a first gate on the first gate dielectric layer, a first hard mask layer on the first gate, and a first spacer on side walls of the first gate dielectric layer, the first gate and the first hard mask layer; and the second gate structure includes a second gate on the third isolation region, a second hard mask layer on the second gate, and a second spacer on side walls of the second gate and the second hard mask layer, the second spacer covering the end portion of the fin adjacent to the third isolation region.

In some implementations of the present application, a third isolation region whose upper surface is higher than an upper surface of a fin is formed on a first isolation region. Therefore, even if a pseudo-gate structure (corresponding to a subsequent second gate structure) subsequently formed on the third isolation region is deviated, the appearance of a semiconductor material in epitaxial growth is not affected, thus avoiding affecting a stress introduced to a channel, and improving carrier mobility of a device.

Through the following detailed description of exemplary embodiments and implementations of the present disclosure with reference to the accompanying drawings, other features, aspects, and advantages of the present disclosure will become clear.

BRIEF DESCRIPTION OF THE DRAWINGS

The accompanying drawings, as a part of the specification, illustrate exemplary embodiments and implementations of the present disclosure and, together with the specification, serve to explain the principles of the present disclosure. In the accompanying drawings.

DETAILED DESCRIPTION

Various exemplary embodiments and implementations of the present disclosure are described in detail with reference to the accompanying drawings. It should be noted that unless otherwise specified, relative layouts, mathematical expressions, and numeric values of components and steps described in these embodiments and implementations should not be construed as a limitation on the scope of the present disclosure.

Meanwhile, it should be understood that for ease of description, sizes of the components shown in the accompanying drawings are not necessarily drawn according to an actual proportional relation. For example, the thickness or width of some layers may be exaggerated with respect to other layers.

The following description about exemplary embodiments and implementations is for illustrative purposes only, and should by no means be used as a limitation on the present disclosure, as well as the application or use thereof.

Technologies, methods, and apparatuses that are known by a person of ordinary skill in the related fields may not be discussed in detail. However, in proper cases, the technologies, methods, and apparatuses should be considered as a part of the specification.

It should be noted that similar reference signs and letters represent similar items in the following accompanying drawings. Therefore, once an item is defined or described in a figure, the item does not need to be further discussed in the subsequent figures.

Figure 1:
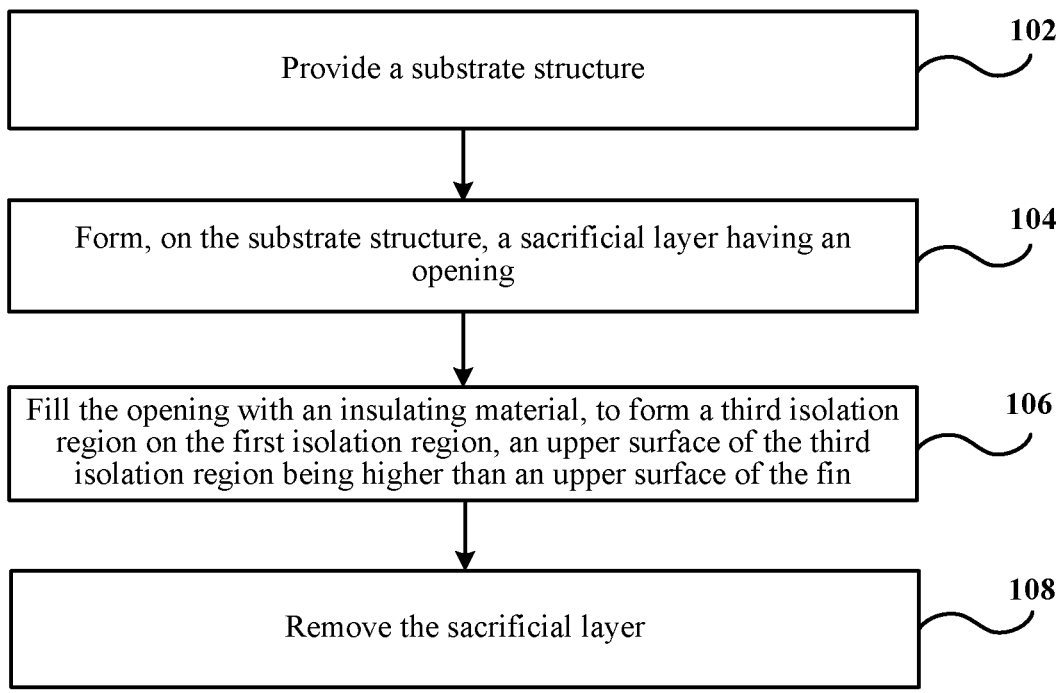
FIG. 1 is a simplified flowchart of one form of a manufacturing method for a semiconductor apparatus.

FIG. 1 is a simplified flowchart of one form of a manufacturing method for a semiconductor apparatus. FIG. 2A to FIG. 9B are cross-sectional views in different phases of a manufacturing method for a semiconductor apparatus. It should be noted that, the term "substantially perpendicular/parallel to" in the text refers to being perpendicular/parallel within a deviation range of a semiconductor process.

Figure 2A:
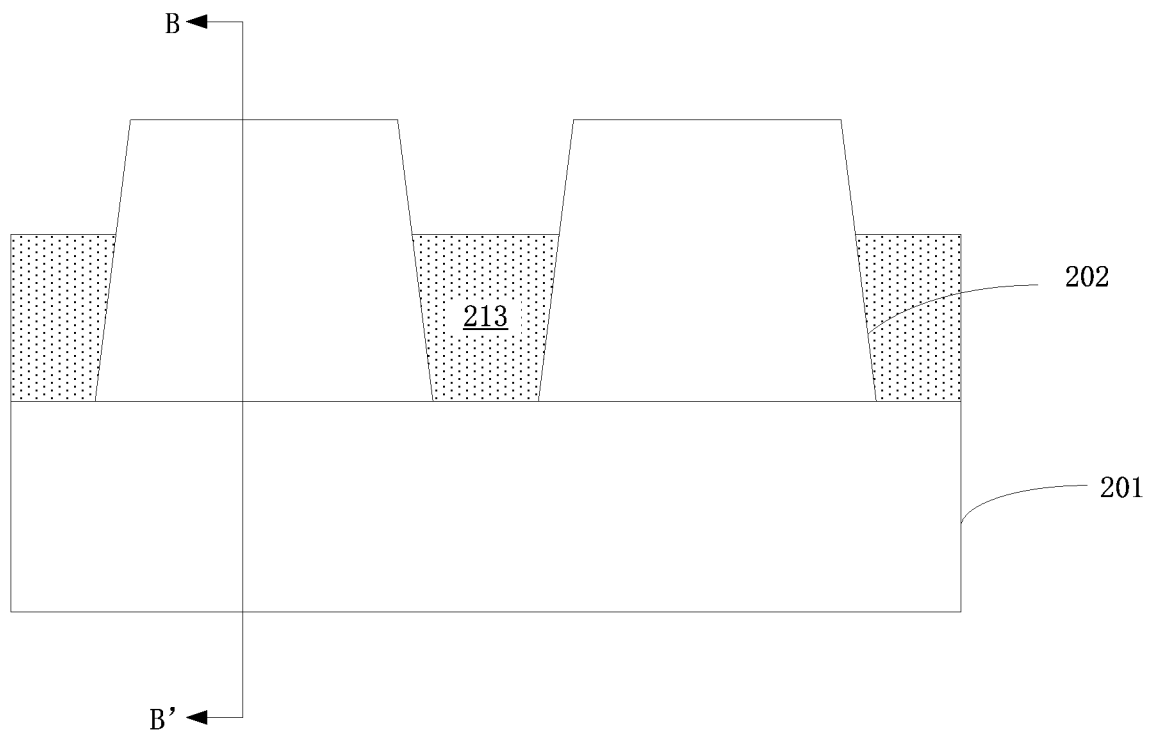
FIG. 2A is a cross-sectional view along a first direction in a phase of a manufacturing method for a semiconductor apparatus.
Figure 2B:
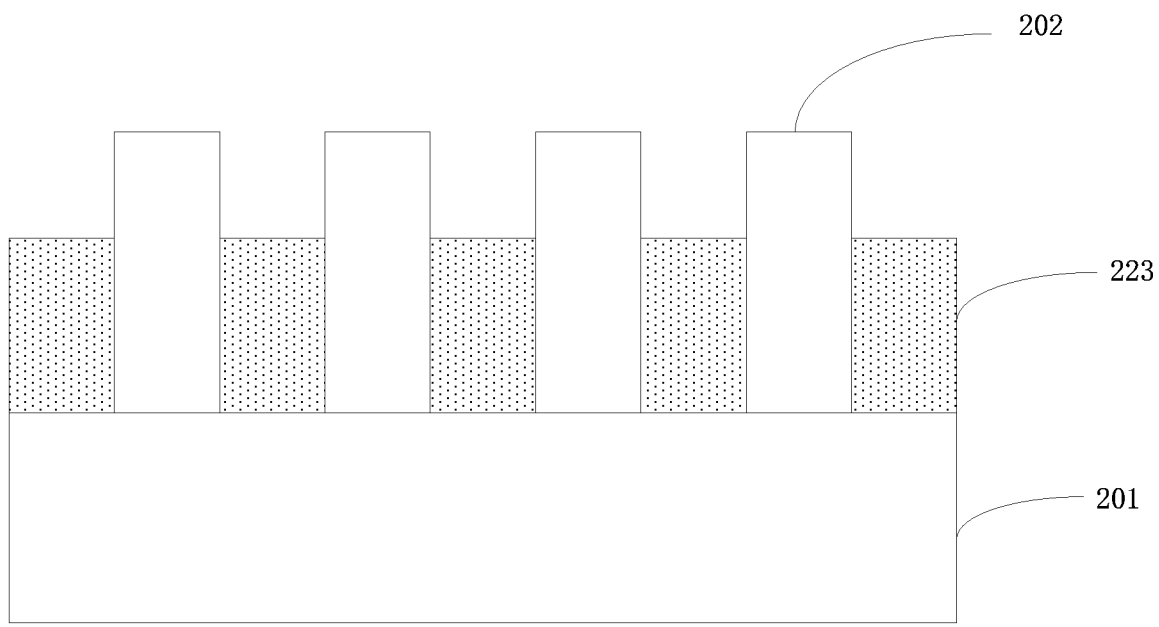
FIG. 2B is a cross-sectional view along a second direction in the phase shown in FIG. 2A.

As shown in FIG. 1, first, in step 102, a substrate structure is provided. FIG. 2A is a cross-sectional view of a substrate structure along a first direction. FIG. 2B is a cross-sectional view taken along B-B' in FIG. 2A and may also be referred to as a cross-sectional view along a second direction. In the subsequent description, unless otherwise specified, FIG. NB refers to a cross-sectional view along a second direction in the phase shown in FIG. NA where N is a positive integer.

As shown in FIG. 2A and FIG. 2B, the substrate structure includes substrate 201. The substrate 201 may be, for example, a silicon substrate, a silicon-on-insulator (SOI) substrate or a substrate of a III-V class semiconductor material.

The substrate structure further includes one or more fins 202 located on the substrate 201 and extending along a first direction. The first direction herein is an extension direction of the fin 202 and may also be referred to as a direction along a channel. It should be noted that, the material of the fin 202 may be a semiconductor material the same as that of the substrate 201 or may be a semiconductor material different from that of the substrate 201.

The substrate structure further includes an isolation region located around the fin 202. Here, an upper surface of the isolation region is lower than an upper surface of the fin 202. The isolation region includes a first isolation region 213 and a second isolation region 223. The first isolation region 213 is located on a side surface of the fin 202 that is in the first direction. The second isolation region 223 is located on a side surface of the fin 202 that is in a second direction that is different from the first direction. Here, the second direction may be, for example, a direction substantially perpendicular to the first direction and may also be referred to as a direction perpendicular to the channel. The first isolation region 213 may be located on either side in the first direction of the fin 202 or may be located on both sides in the first direction of the fin 202. Similarly, the second isolation region 223 may be located on either side in the second direction of the fin 202 or may be located on both sides in the second direction of the fin 202. In some implementations, the material of the isolation region may be a dielectric material such as an oxide, a nitride or an oxynitride.

Figure 6A:
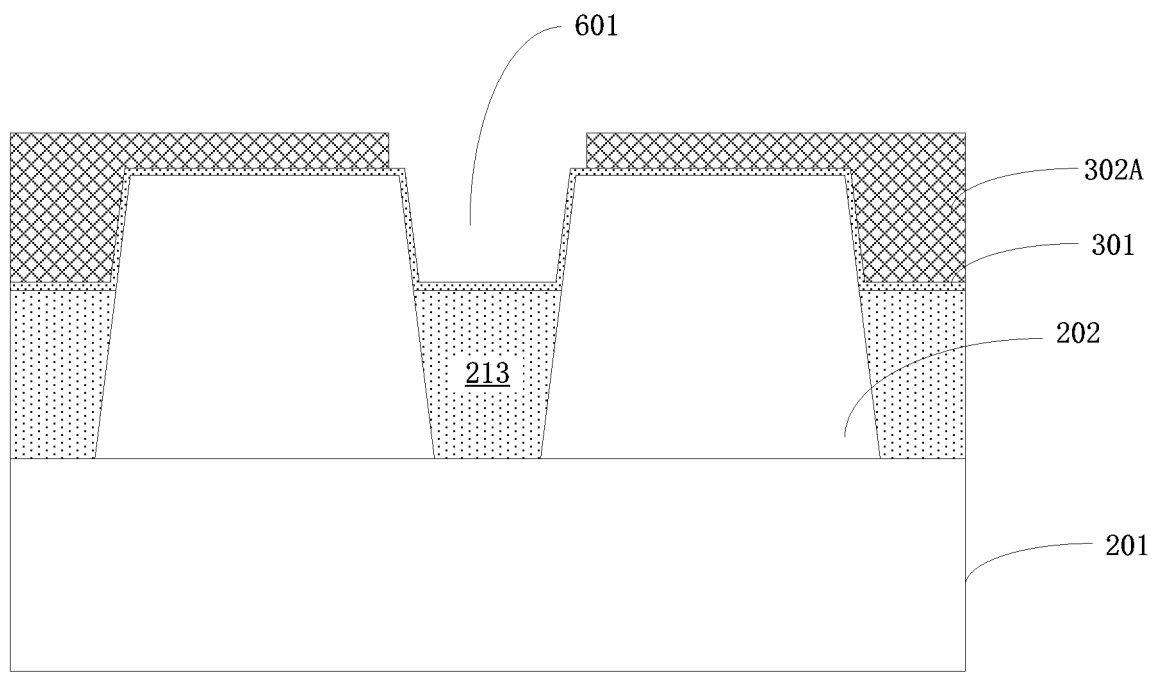
FIG. 6A is a cross-sectional view along a first direction in a phase of a manufacturing method for a semiconductor apparatus.

Then, in step 104, a sacrificial layer 302A having an opening 601 is formed on the substrate structure. The opening 601 exposes the upper surface of the first isolation region 213 and exposes a part, which is located above the first isolation region 213, of the side surface of the fin 202 adjacent to the first isolation region 213, as shown in FIG. 6A.

A specific implementation of step 104 is described hereinafter with reference to FIG. 3A to FIG. 6B.

Figure 3A:
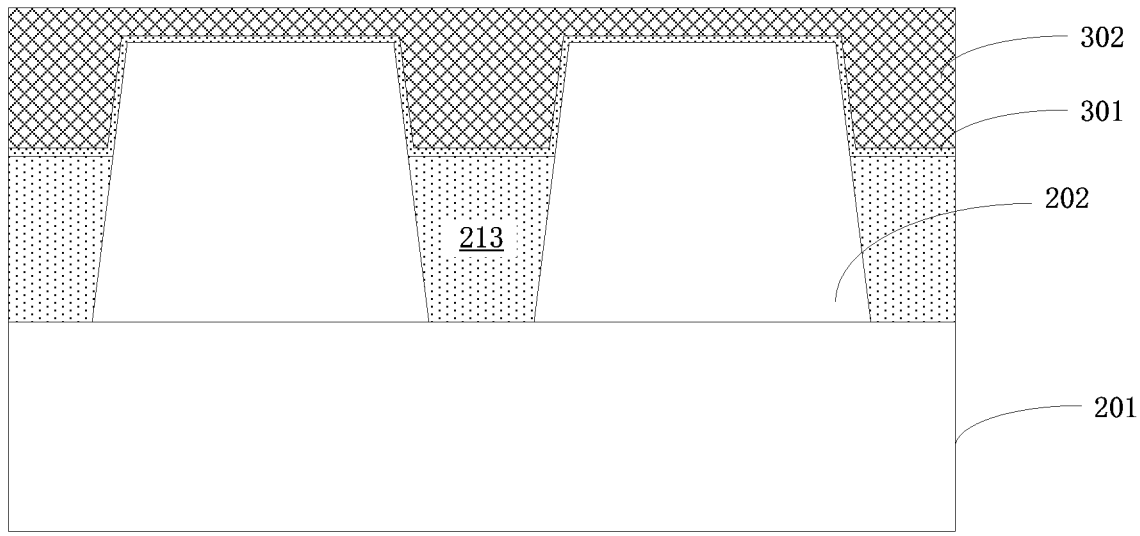
FIG. 3A is a cross-sectional view along a first direction in a phase of a manufacturing method for a semiconductor apparatus.
Figure 3B:
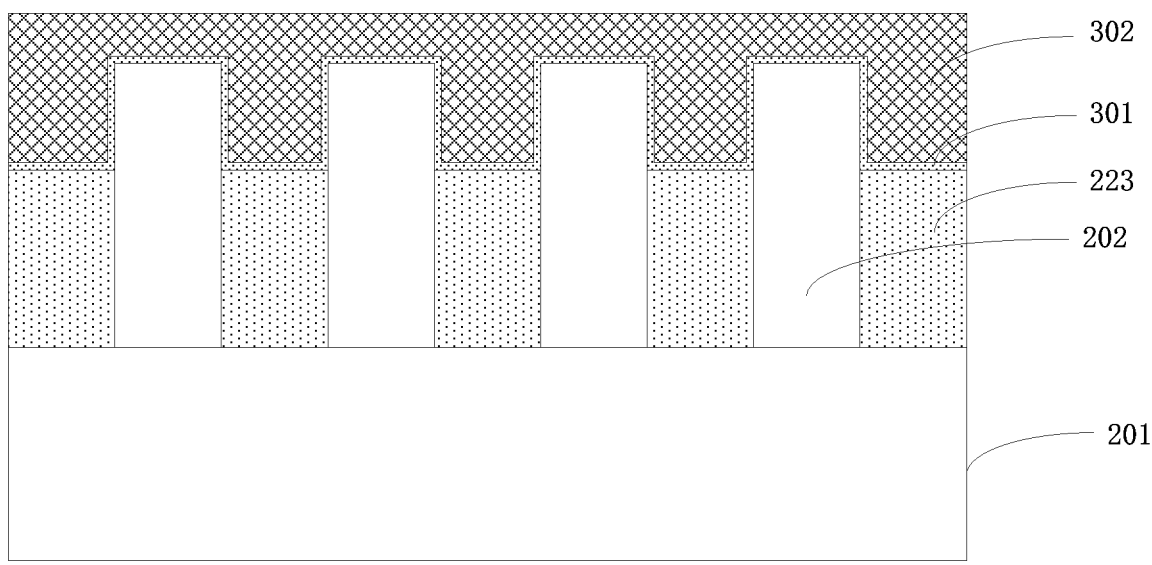
FIG. 3B is a cross-sectional view along a second direction in the phase shown in FIG. 3A.

As shown in FIG. 3A and FIG. 3B, a sacrificial material layer 302 is formed above the substrate structure. Optionally, a protection layer 301 such as a silicon oxide may be first formed on the substrate structure. Then, a sacrificial material layer 302 is formed on the protection layer 301. The sacrificial material layer 302 may be, for example, a silicon nitride (such as SiN), a silicon oxynitride (such as SiON) or a silicon oxycarbide (such as SiOC). The protection layer 301 may protect the fin 202 from losses in a subsequent etching process.

Figure 4A:
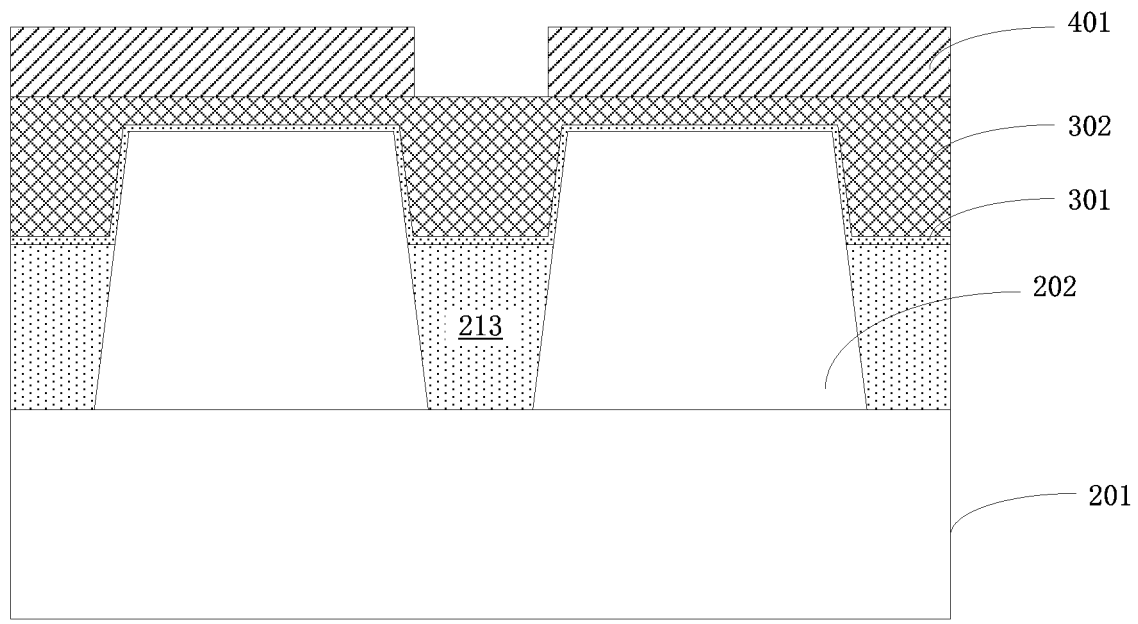
FIG. 4A is a cross-sectional view along a first direction in a phase of a manufacturing method for a semiconductor apparatus.
Figure 4B:
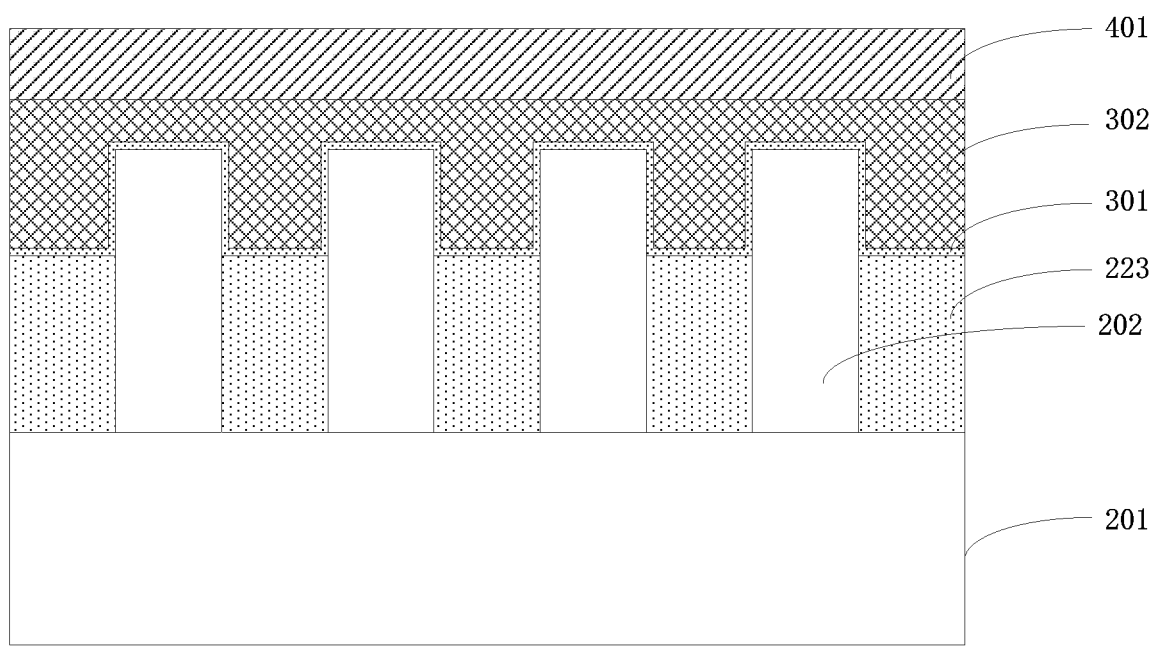
FIG. 4B is a cross-sectional view along a second direction in the phase shown in FIG. 4A.

As shown in FIG. 4A and FIG. 4B, a patterned mask layer 401 is formed on the sacrificial material layer 302. In some implementations, a photoresist may be coated on the sacrificial material layer 302 and then the photoresist is patterned to form the mask layer 401. For example, the photoresist may be patterned using a Single Diffusion Break (SDB) technology. The mask layer 401 may define the position of a subsequently formed opening. Optionally, before the mask layer 401 is formed, the surface of the sacrificial material layer 302 may be oxidized, to form an oxide layer. The oxide layer formed on the surface of the sacrificial material layer 302 may avoid a direct contact between the sacrificial material layer 302 such as SiN and the photoresist containing organic matter, thus avoiding a defect of the sacrificial material layer 302. It should be noted that, the oxide layer formed herein may be properly removed in a subsequent process.

Figure 5A:
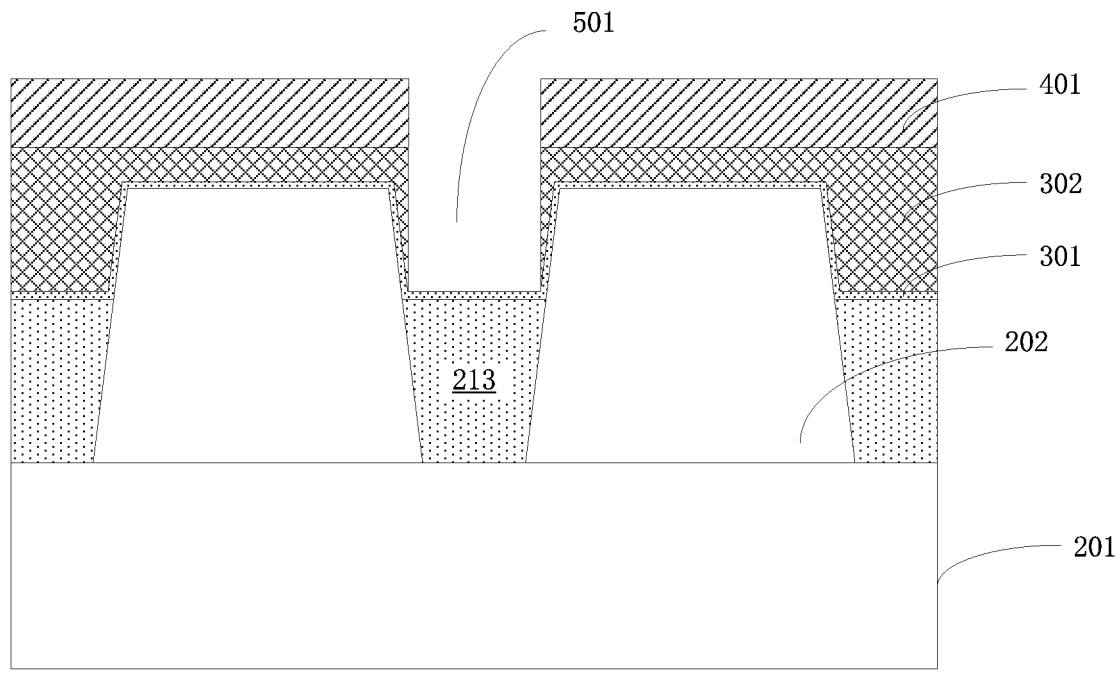
FIG. 5A is a cross-sectional view along a first direction in a phase of a manufacturing method for a semiconductor apparatus.
Figure 5B:
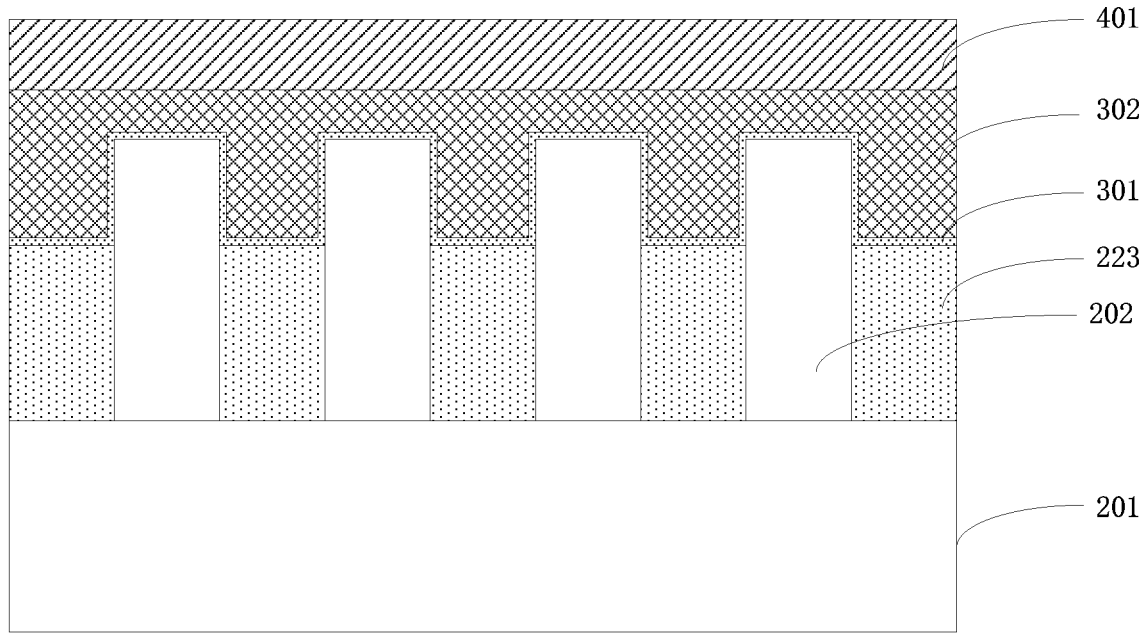
FIG. 5B is a cross-sectional view along a second direction in the phase shown in FIG. 5A.

As shown in FIG. 5A and FIG. 5B, the sacrificial material layer 302 is etched, using the mask layer 401 as a mask, to form a first opening 501. For example, a dry etching is employed. Here, the first opening 501 exposes the upper surface of the first isolation region 213. It should be understood that, although the protection layer 301 is shown on the first isolation region 213, this is only an optional implementation. The protection layer 301 may be formed on the surface of the fin 202 only and not formed on the surface of the first isolation region 213. When the surface of the first isolation region 213 is provided with the protection layer 301, the first opening 501 exposes the protection layer 301 on the first isolation region 213.

Figure 6B:
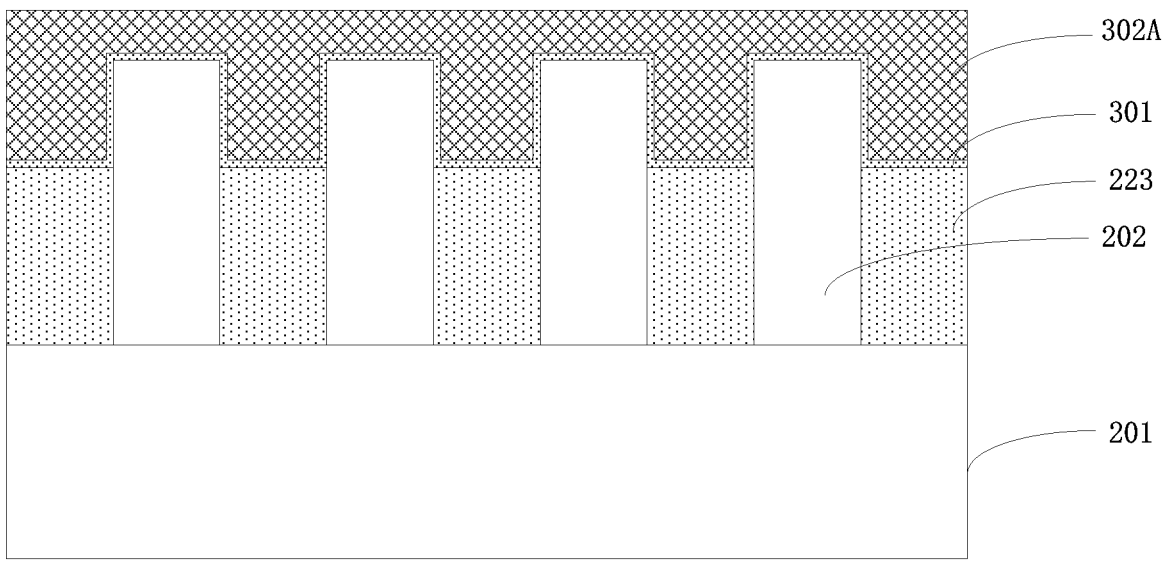
FIG. 6B is a cross-sectional view along a second direction in the phase shown in FIG. 6A.

As shown in FIG. 6A and FIG. 6B, the mask layer 401 is removed. Then, wet etching is performed to expand the first opening 501 to be the opening 601, so that the part, which is located above the first isolation region 213, of the side surface of the fin 202 adjacent to the first isolation region 213 is exposed. After the wet etching, the remaining sacrificial material layer 302 is used as the sacrificial layer 302A. It should be understood that, the material of the sacrificial layer 302A is the same as the material of the sacrificial material layer 302.

In this way, the sacrificial layer 302A having the opening 601 is formed. In some implementations, the opening 601 may further expose an end portion of the fin 202 adjacent to the first isolation region 213.

Then, referring to FIG. 1 continuously, in step 106, the opening 601 is filled with an insulating material to form a third isolation region 801 on the first isolation region 213. An upper surface of the third isolation region 801 is higher than the upper surface of the fin 202, as shown in FIG. 8A.

A specific implementation of step 106 is described hereinafter with reference to FIG. 7A to FIG. 8B.

Figure 7A:
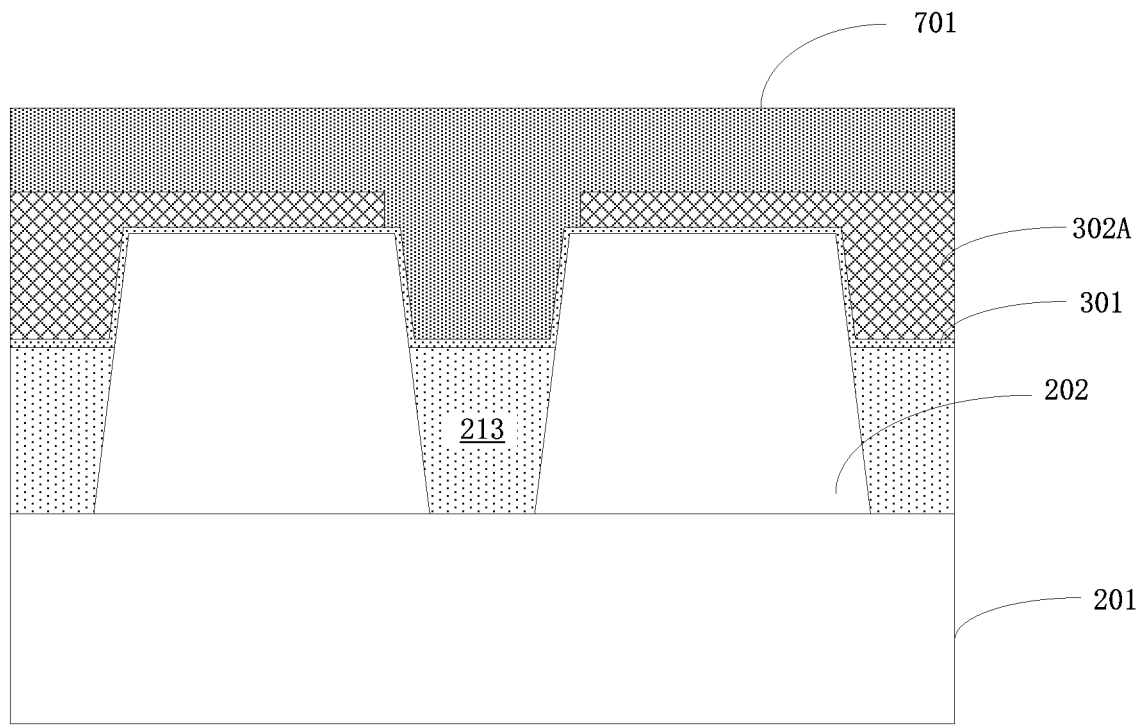
FIG. 7A is a cross-sectional view along a first direction in a phase of a manufacturing method for a semiconductor apparatus.
Figure 7B:
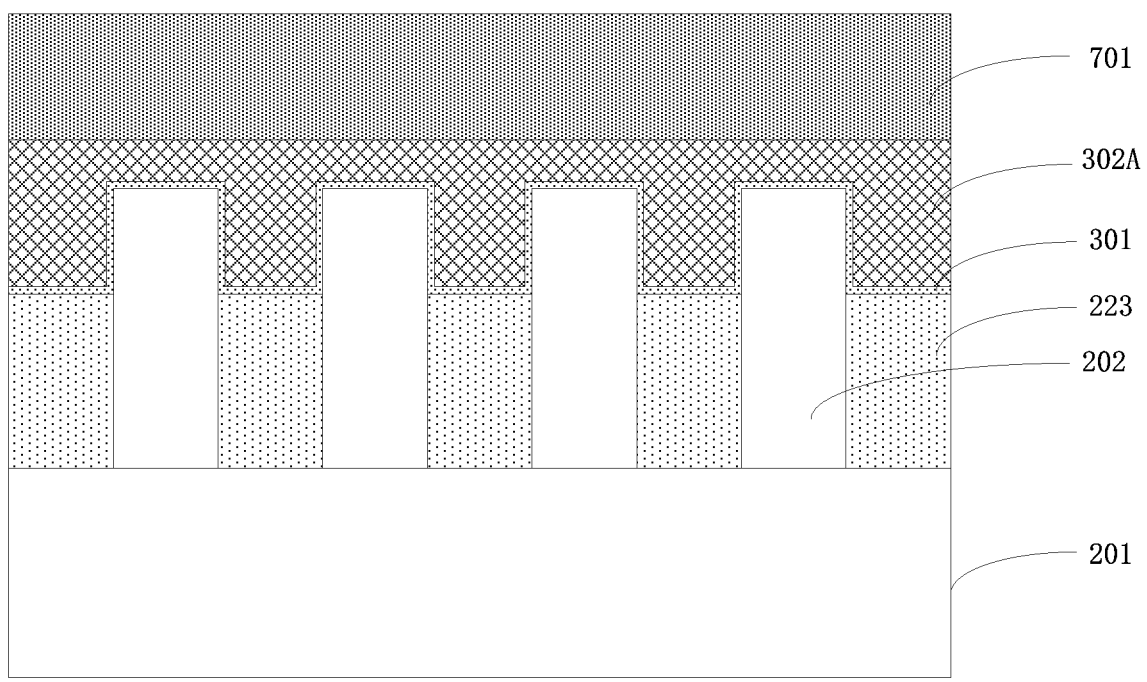
FIG. 7B is a cross-sectional view along a second direction in the phase shown in FIG. 7A.

As shown in FIG. 7A and FIG. 7B, after the sacrificial layer 302A having the opening 601 is formed, an insulating material 701 covering the substrate structure is formed to fill the opening 601. The insulating material 701 may include a silicon oxide. In some implementations, a silicon oxide (such as silicon dioxide) may be formed by using a high density plasma (HDP) technology to serve as the insulating material 701. In this way, indentations to be formed in a subsequent flattening process may be reduced.

Figure 8A:
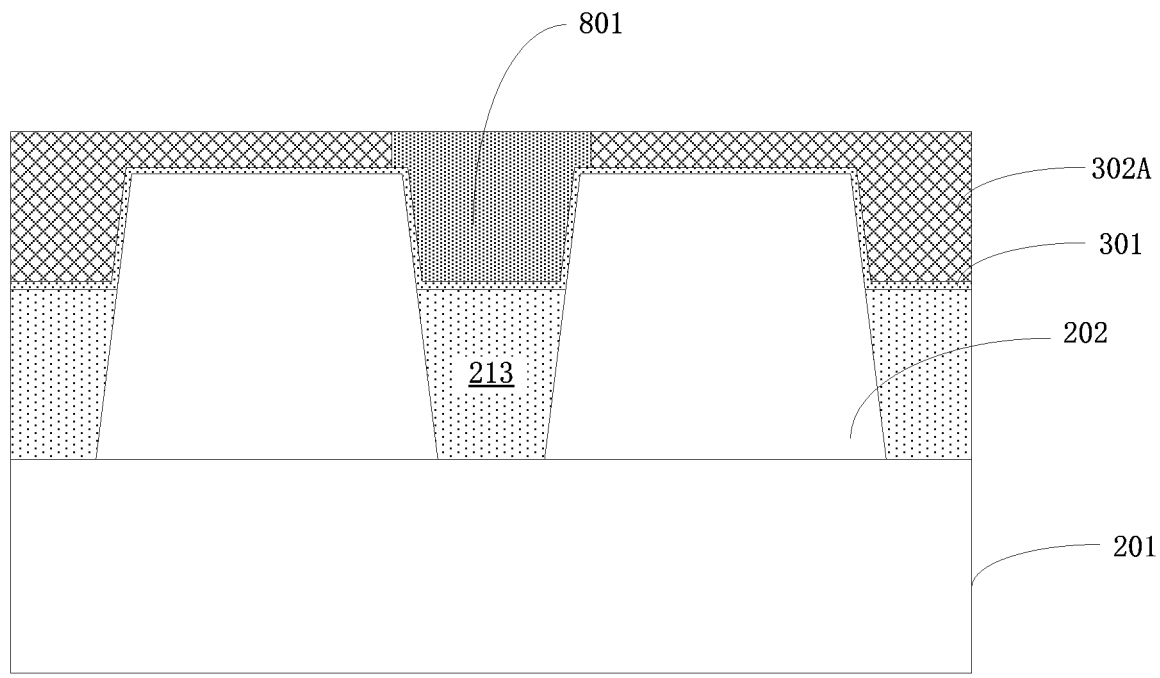
FIG. 8A is a cross-sectional view along a first direction in a phase of a manufacturing method for a semiconductor apparatus.
Figure 8B:
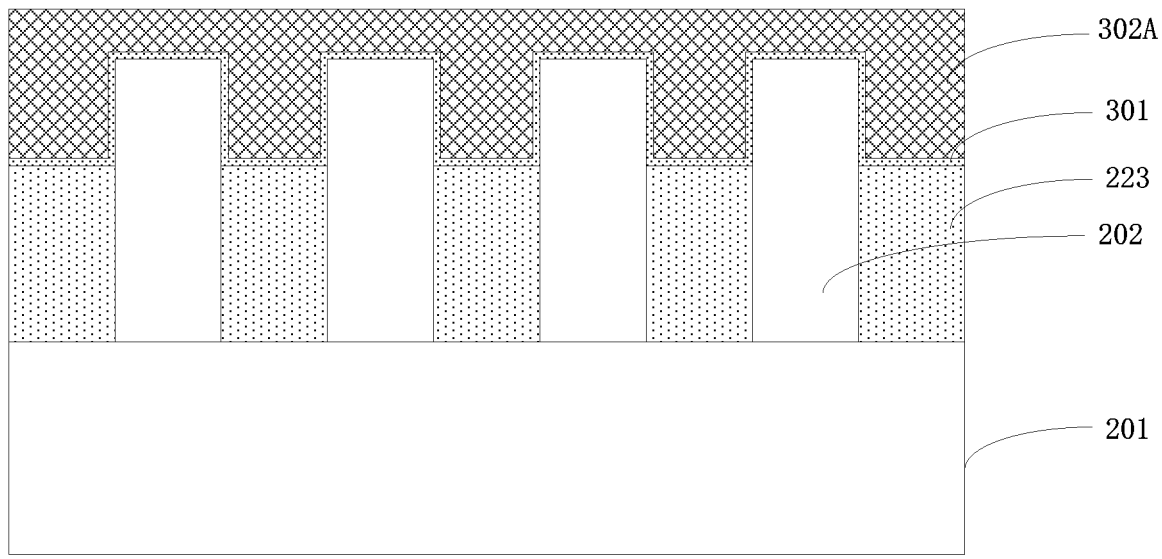
FIG. 8B is a cross-sectional view along a second direction in the phase shown in FIG. 8A.

As shown in FIG. 8A and FIG. 8B, the insulating material 701 is flattened using the sacrificial layer 302A as a stop layer, so that an upper surface of the insulating material 701 in the opening 601 is substantially flush with an upper surface of the sacrificial layer 302A, thus forming the third isolation region 801. If the opening 601 exposes the end portion of the fin 202 adjacent to the first isolation region 213, the third isolation region 801 covers the end portion.

Figure 9A:
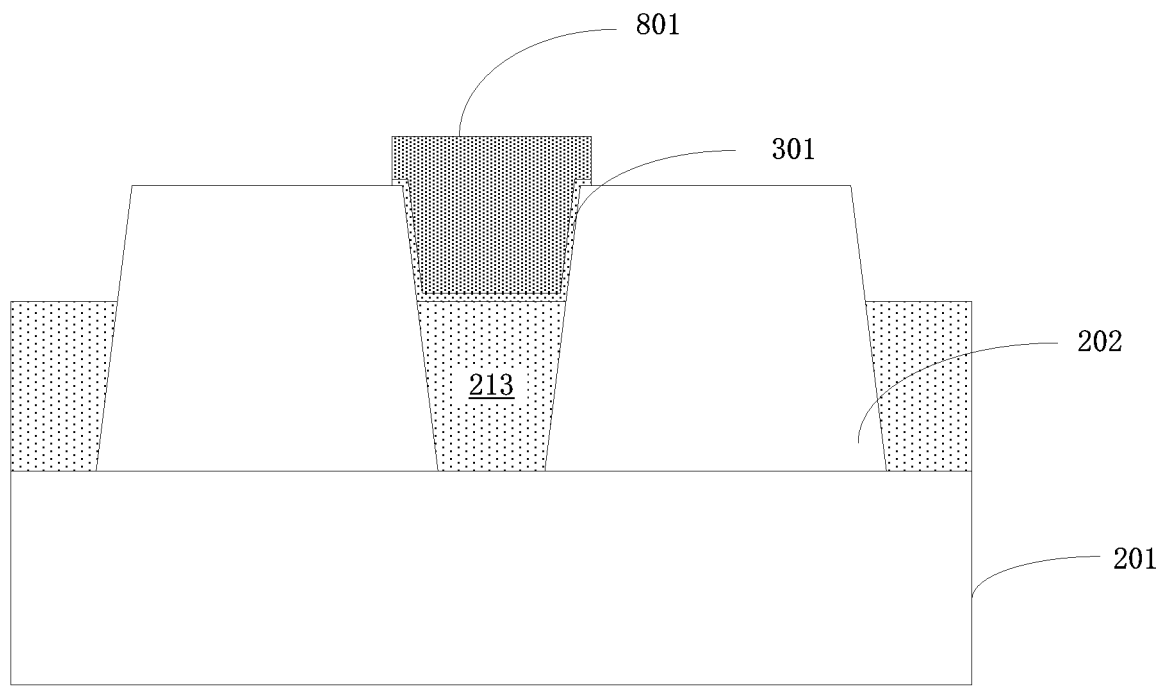
FIG. 9A is a cross-sectional view along a first direction in a phase of a manufacturing method for a semiconductor apparatus.
Figure 9B:
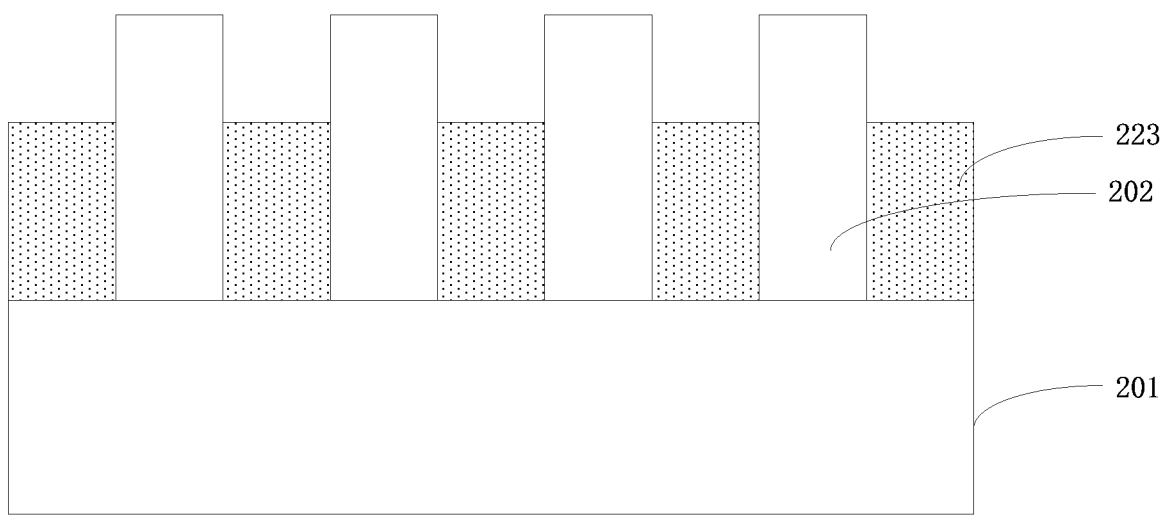
FIG. 9B is a cross-sectional view along a second direction in the phase shown in FIG. 9A.

Then, in step 108, the sacrificial layer 302A is removed, as shown in FIG. 9A and FIG. 9B. It should be noted that, if the sacrificial layer 302A is provided with the protection layer 301, the protection layer 301 under the sacrificial layer 302A is further removed after the sacrificial layer 302A is removed.

Forms of a manufacturing method for a semiconductor apparatus are described above. In forms of the method, a third isolation region whose upper surface is higher than an upper surface of a fin is formed on a first isolation region. Therefore, even if a pseudo-gate structure (corresponding to a subsequent second gate structure) subsequently formed on the third isolation region is deviated, the appearance of a semiconductor material in epitaxial growth is not affected, thereby avoiding affecting a stress introduced to a channel, and improving carrier mobility of a device.

The present disclosure further provides semiconductor apparatus. Implementations of the semiconductor apparatus may be manufactured using the foregoing method, but is not limited to being manufactured using the foregoing method. Implementations of a semiconductor apparatus are described hereinafter with reference to FIG. 9A and FIG. 9B.

As shown in FIG. 9A and FIG. 9B, a semiconductor apparatus includes a substrate 201, one or more fins 202 located on the substrate 201 and extending along a first direction, and an isolation region located around the fin 202. The isolation region herein includes a first isolation region 213 and a second isolation region 223. The first isolation region 213 is located on a side surface of the fin 202 that is in the first direction. The second isolation region 223 is located on a side surface of the fin 202 that is in a second direction that is different from the first direction. An upper surface of the first isolation region 213 is substantially flush with an upper surface of the second isolation region 223 and is lower than an upper surface of the fin 202.

The semiconductor apparatus further includes a third isolation region 801 located on the first isolation region 213. In some implementations, the third isolation region 801 may cover an end portion of the fin 202 adjacent to the first isolation region 213.

In some implementations, referring to FIG. 9A and FIG. 9B, the semiconductor apparatus may further include a protection layer 301 between the third isolation region 801 and the fin 202.

Figure 10:
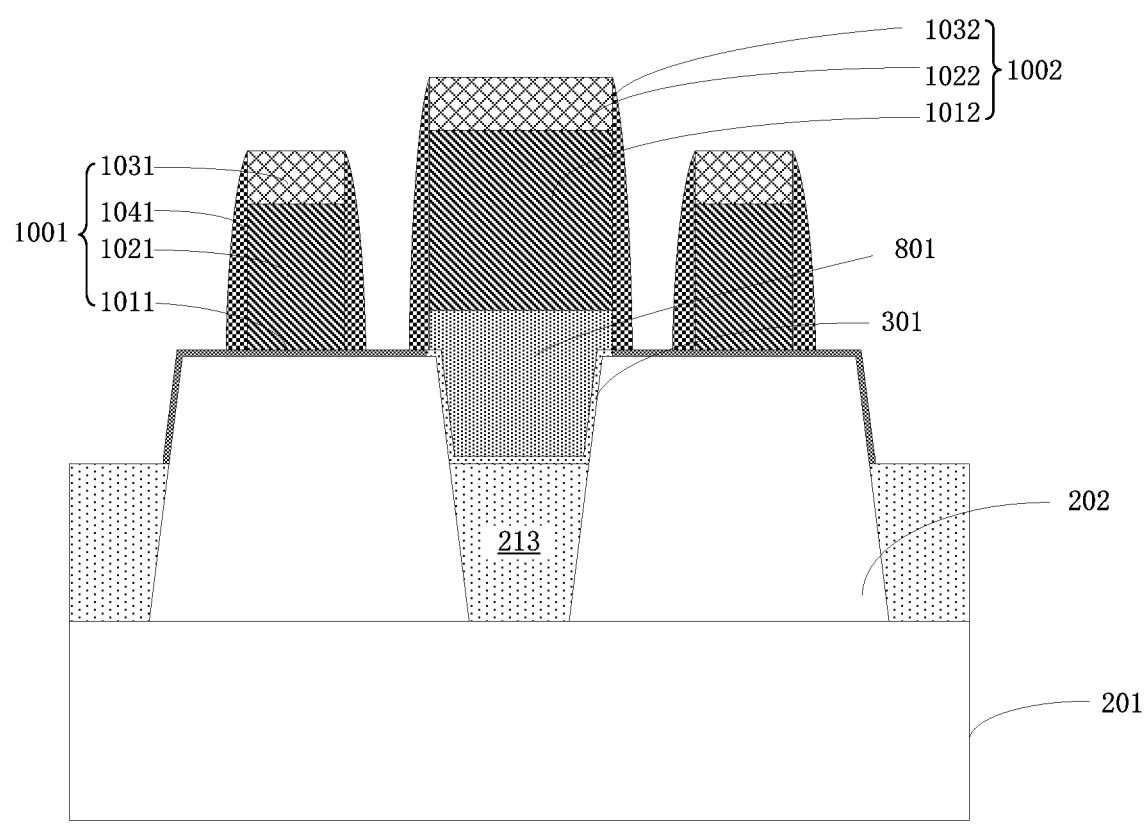
FIG. 10 is a cross-sectional view along a first direction in a phase of a manufacturing method for a semiconductor apparatus.

After the semiconductor apparatus shown in FIG. 9A and FIG. 9B is formed, in some implementations, the foregoing method may further include: forming a first gate structure 1001 on the fin 202 and forming a second gate structure 1002 on the third isolation region 801, as shown in FIG. 10. Here, the second gate structure is generally a pseudo-gate structure.

In some implementations, the first gate structure 1001 may include a first gate dielectric layer 1011, such as silicon oxide, on the fin 202; a first gate 1021, such as polycrystalline silicon, on the first gate dielectric layer 1011; a first hard mask layer 1031, such as silicon nitride, on the first gate 1021; and a first spacer 1041, such as silicon oxide or silicon nitride, on side walls of the first gate 1021 and the first hard mask layer 1031. For example, the first gate dielectric layer 1011 may be formed by means of thermal oxidation.

In some implementations, the second gate structure 1002 may include a second gate 1012, such as polycrystalline silicon, on the third isolation region 801; a second hard mask layer 1022, such as silicon nitride, on the second gate 1012; and a second spacer 1032, such as silicon oxide or silicon nitride, on side walls of the second gate 1012 and the second hard mask layer 1022. Here, the second spacer 1032 covers the end portion of the fin 202 adjacent to the first isolation region 213.

Figure 11:
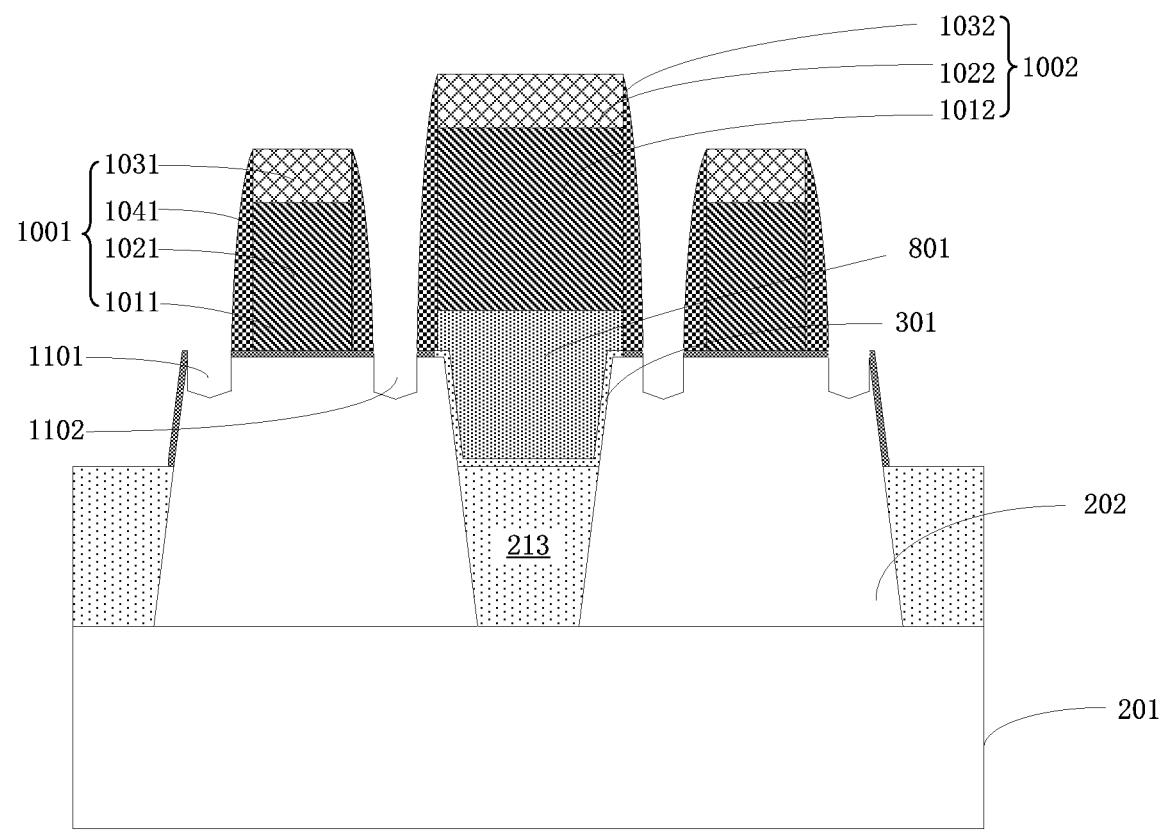
FIG. 11 is a cross-sectional view along a first direction in a phase of a manufacturing method for a semiconductor apparatus.
Figure 12:
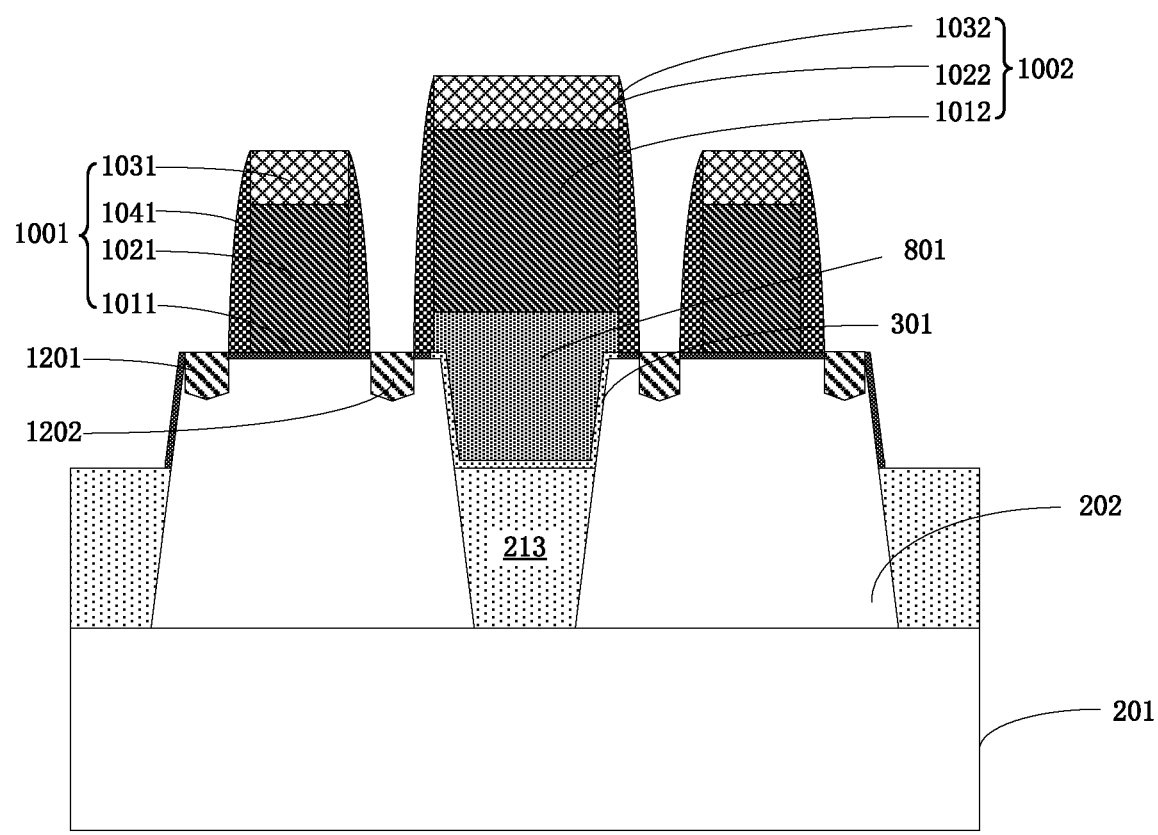
FIG. 12 is a cross-sectional view along a first direction in a phase of a manufacturing method for a semiconductor apparatus.

After the first gate structure 1001 and the second gate structure 1002 are formed, in some implementations, the foregoing method may further include the following steps:

Fins 202 on both sides of the first gate structure 1001 are etched using the first gate structure 1001 and the second gate structure 1002 as masks, to form indentations such as a first indentation 1101 and a second indentation 1102, as shown in FIG. 11. Then, a semiconductor material is epitaxially grown in the indentations to form a source region and a drain region. For example, the semiconductor material is separately epitaxially grown in the first indentation 1101 and the second indentation 1102 to form a source region 1201 and a drain region 1202, as shown in FIG. 12. In some implementations, the epitaxially grown semiconductor material may include SiGe, SiC or Si. In addition, P may be in-situ doped during epitaxial growth of Si.

The present disclosure further provides another semiconductor apparatus, as shown in FIG. 12. Compared with the apparatus shown in FIG. 9A, the semiconductor apparatus shown in FIG. 12 further includes a first gate structure 1001 on the fin 202 and a second gate structure 1002 on the third isolation region 801. In addition, the semiconductor apparatus may further include a source region 1201 and a drain region 1202 that are separately formed on both sides of the first gate structure 1001 by means of epitaxial growth of a semiconductor material. In some implementations, specific structures of the first gate structure 1001 and the second gate structure 1002 may be the structures as described above and details are not described herein again.

In implementations of the semiconductor apparatus provided in the present application, a third isolation region whose upper surface is higher than an upper surface of a fin is provided on a first isolation region. Therefore, even if a pseudo-gate structure (corresponding to a subsequent second gate structure) subsequently formed on the third isolation region is deviated, the appearance of a semiconductor material in epitaxial growth is not affected, thereby avoiding affecting a stress introduced to a channel, and improving carrier mobility of a device.

The present disclosure further provides exemplary methods for forming the foregoing substrate structure. A detailed description is made hereinafter with reference to FIG. 13A to FIG. 17B.

Figure 13A:
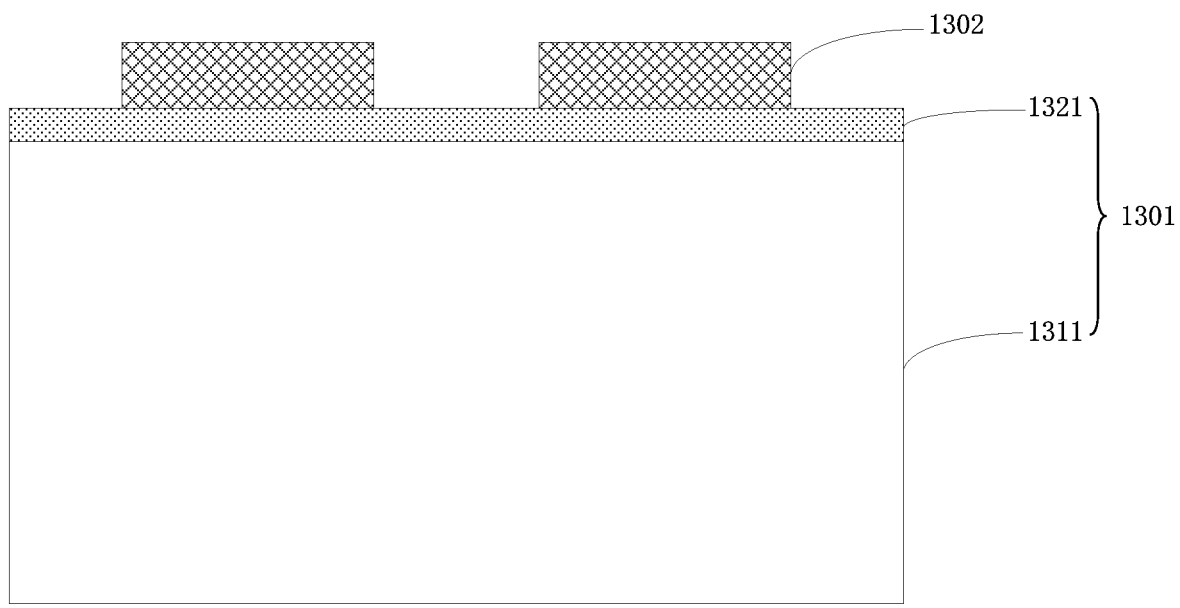
FIG. 13A is a cross-sectional view along a first direction in a phase in forming of a substrate structure.
Figure 13B:
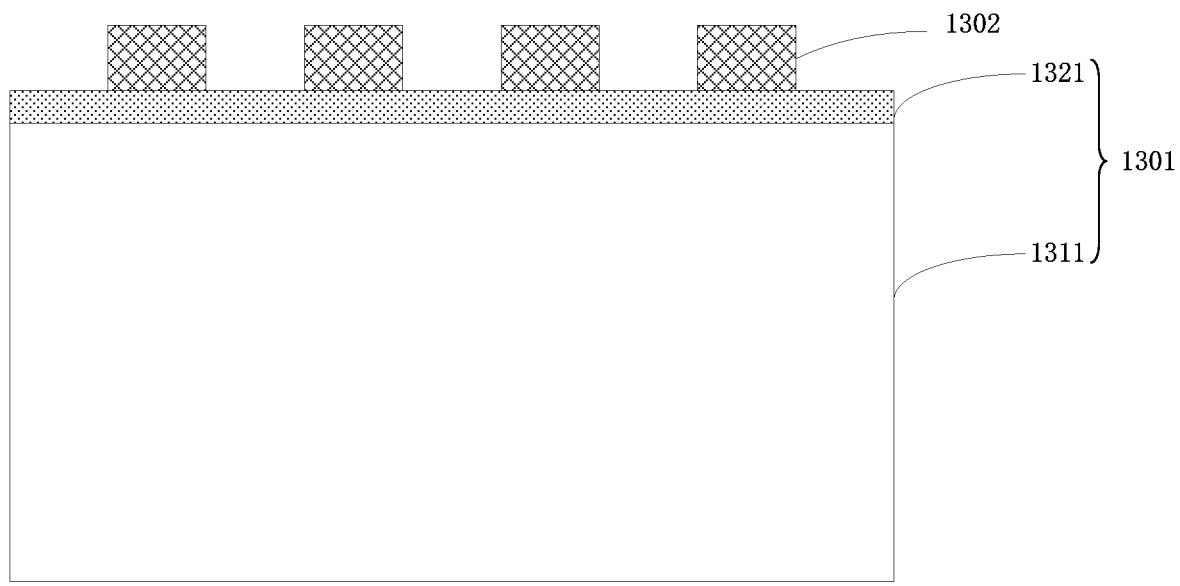
FIG. 13B is a cross-sectional view along a second direction in the phase shown in FIG. 13A.

First, as shown in FIG. 13A and FIG. 13B, an initial substrate 1301 is provided and a patterned hard mask 1302, such as silicon nitride, is formed on the initial substrate 1301. For example, the patterned hard mask 1302 may be formed by means of self-aligned double patterning (SADP). In some implementations, the initial substrate 1301 may include an initial semiconductor layer 1311 and an initial buffer layer 1321 located on the initial semiconductor layer. The initial buffer layer 1321 can reduce a stress between the hard mask 1302 and the initial substrate 1301.

Figure 14A:
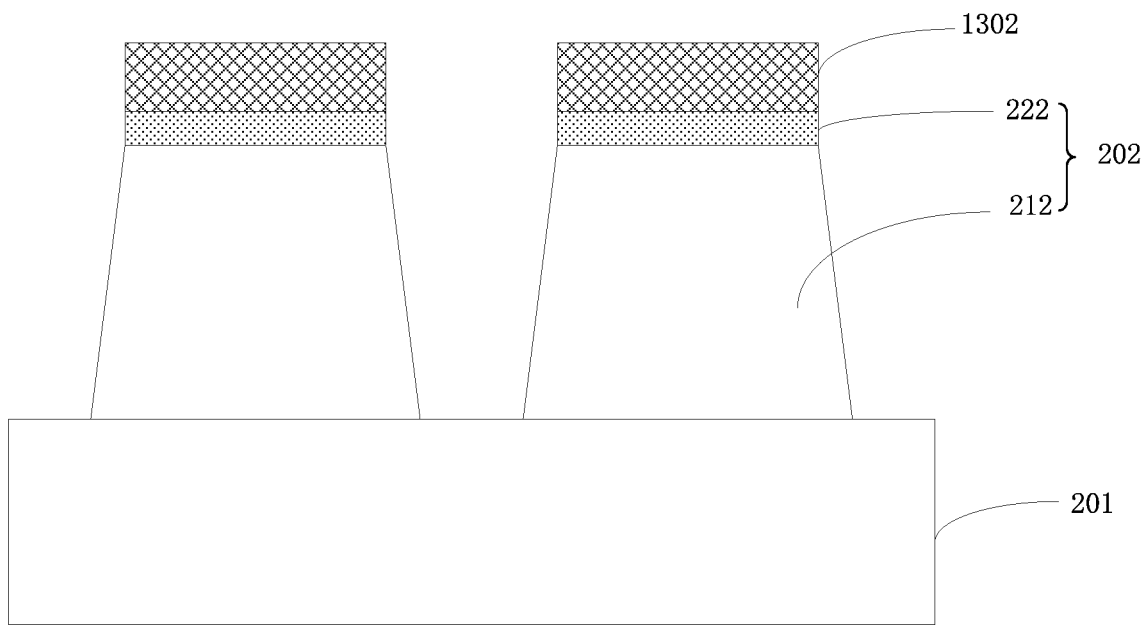
FIG. 14A is a cross-sectional view along a first direction in a phase in forming of a substrate structure.
Figure 14B:
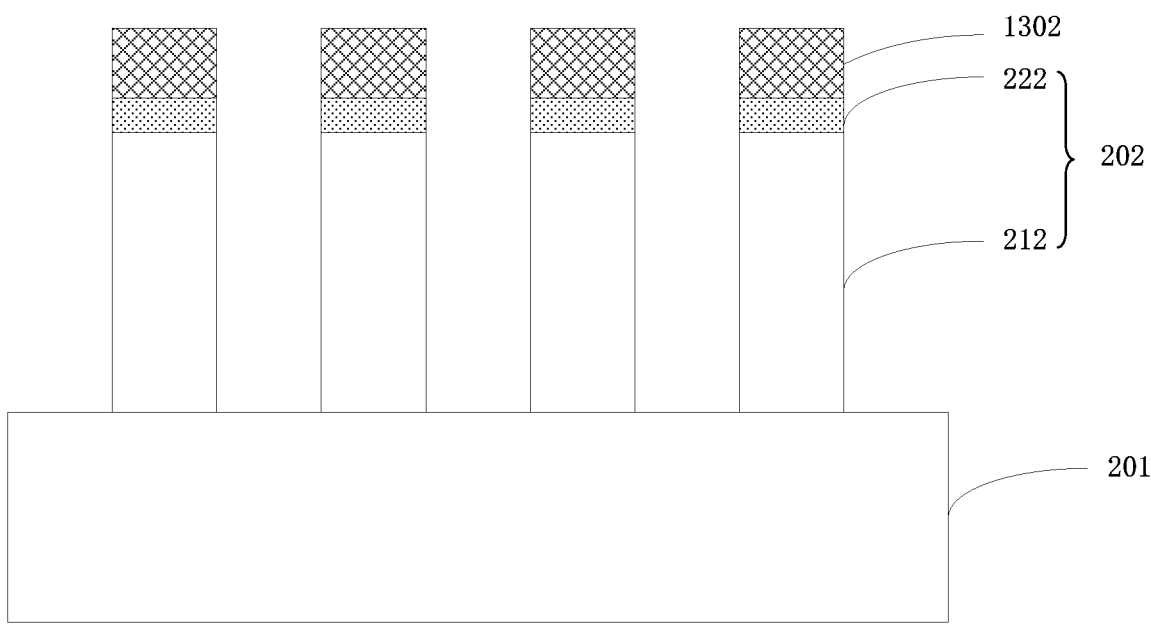
FIG. 14B is a cross-sectional view along a second direction in the phase shown in FIG. 14A.
Figure 15A:
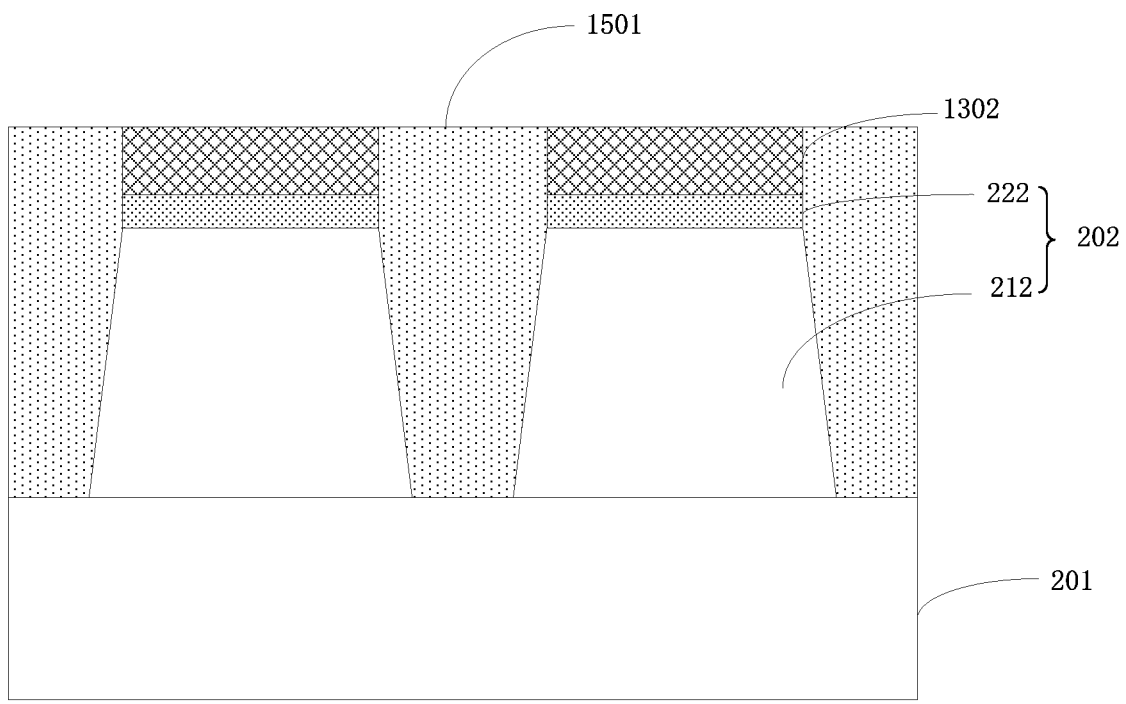
FIG. 15A is a cross-sectional view along a first direction in a phase in forming of a substrate structure.
Figure 15B:
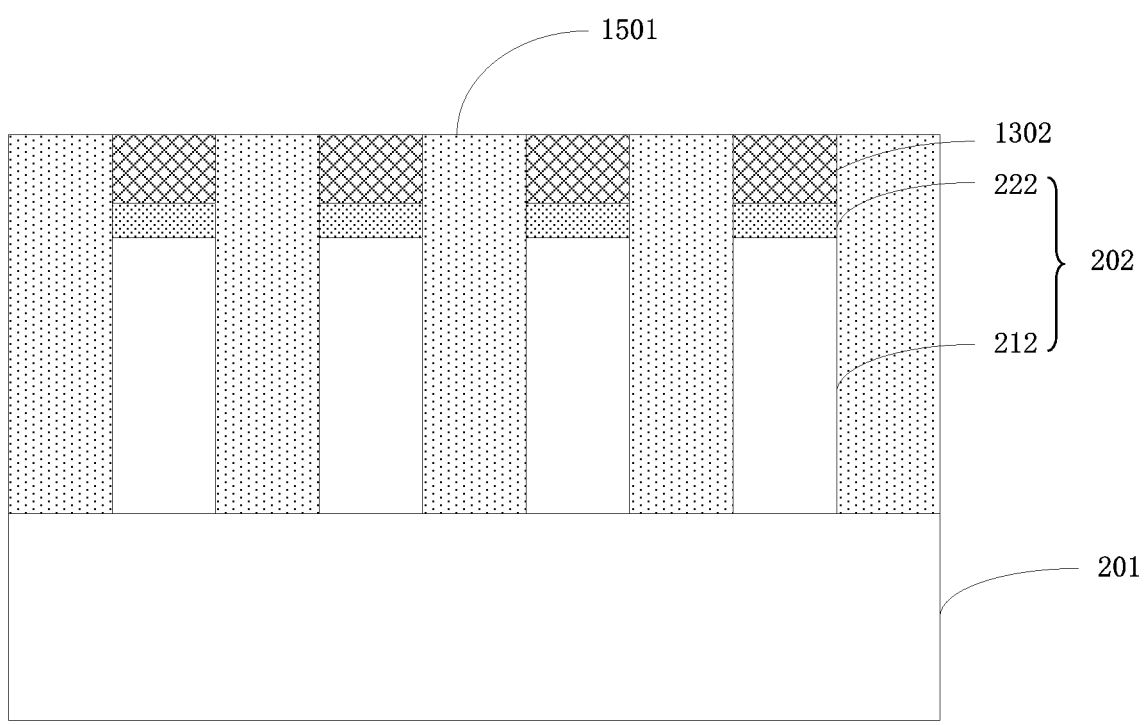
FIG. 15B is a cross-sectional view along a second direction in the phase shown in FIG. 15A.

Then, as shown in FIG. 14A and FIG. 14B, the initial substrate 1301 is etched using the hard mask 1302 as a mask, thereby forming a substrate 201 and one or more fins 202 located on the substrate 201. In some implementations, the initial substrate 1301 may include an initial semiconductor layer 1311 and an initial buffer layer 1321 on the initial semiconductor layer 1311. Therefore, the fin 202 formed after the etching may include a semiconductor layer 212 and a buffer layer 222 located on the semiconductor layer 212.

Next, as shown in FIG. 5A and FIG. 5B, an isolation material 1501 is deposited to fill space around the fin 202. An upper surface of the isolation material 1501 is substantially flush with an upper surface of the hard mask 1302. For example, the isolation material 1501 (such as silicon oxide) may be deposited by means of flow chemical vapor deposition (FCVD). Then, flattening, such as chemical mechanical polishing (CMP), is performed on the isolation material 1501, so that the upper surface of the isolation material 1501 is substantially flush with the upper surface of the hard mask 1302. In some implementations, before the isolation material 1501 is deposited, a liner may further be formed on the surface of the structure shown in FIG. 14A. For example, silicon oxide may be formed by means of in situ steam generation (ISSG) to serve as the liner. The liner may repair damage on the surface of the fin 202 caused by the etching process.

Figure 16A:
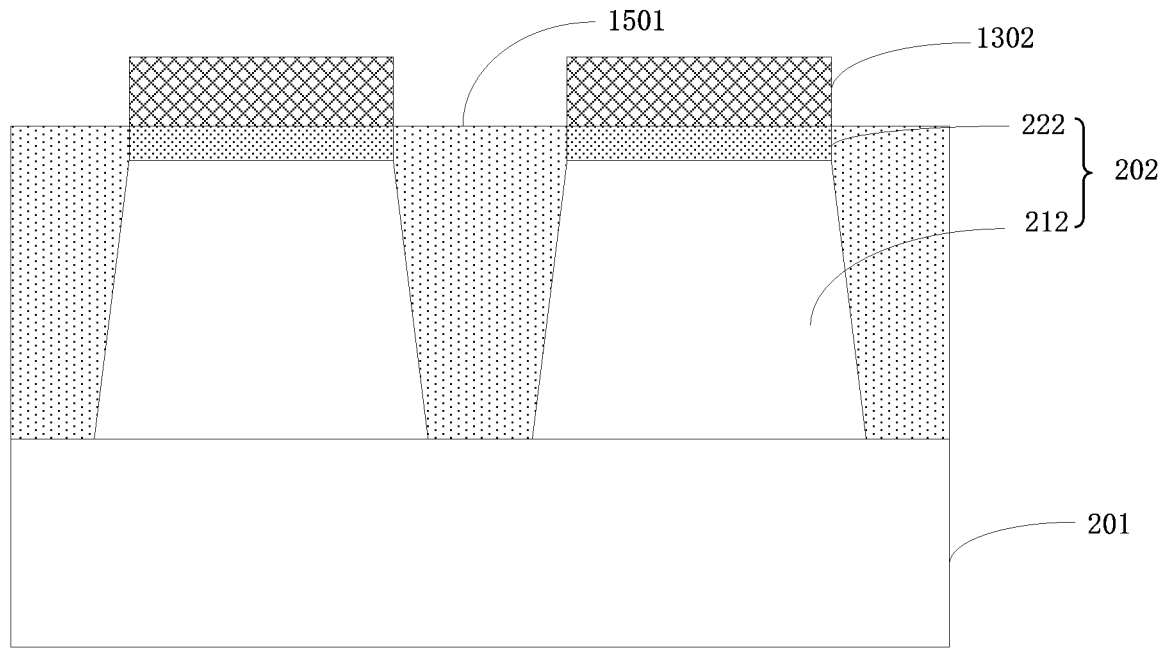
FIG. 16A is a cross-sectional view along a first direction in a phase in forming of a substrate structure.
Figure 16B:
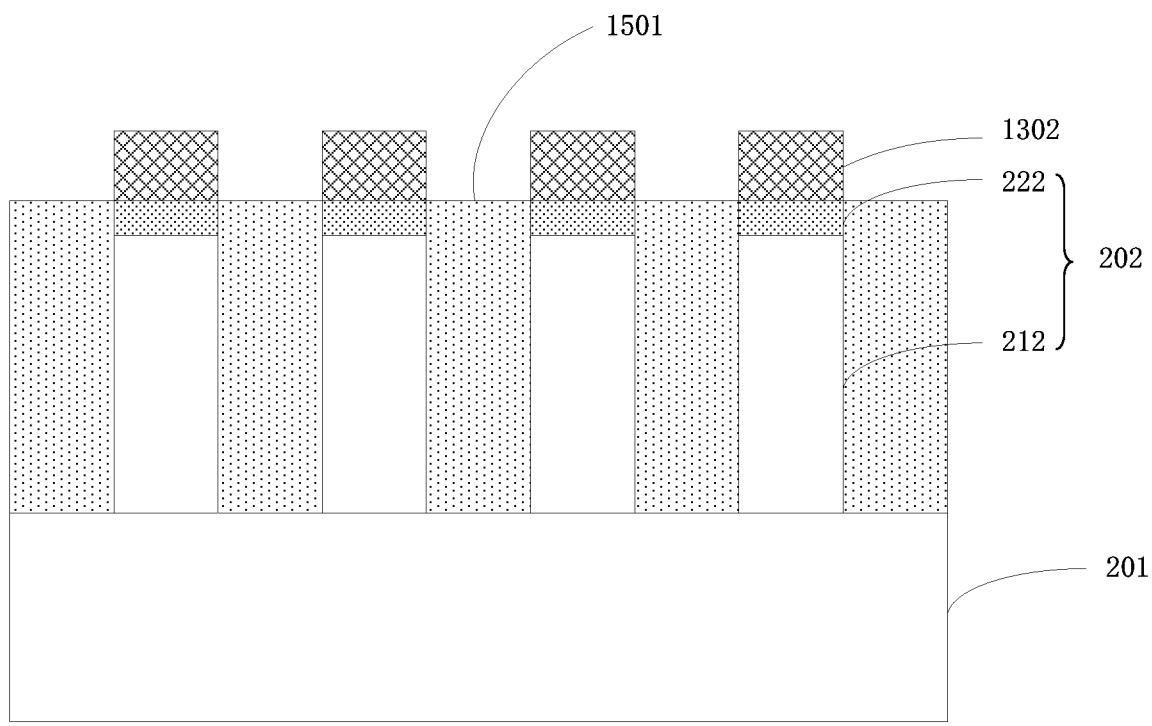
FIG. 16B is a cross-sectional view along a second direction in the phase shown in FIG. 16A.

Then, as shown in FIG. 16A and FIG. 16B, first back-etching is performed on the isolation material 1501 to expose the hard mask 1302.

Figure 17A:
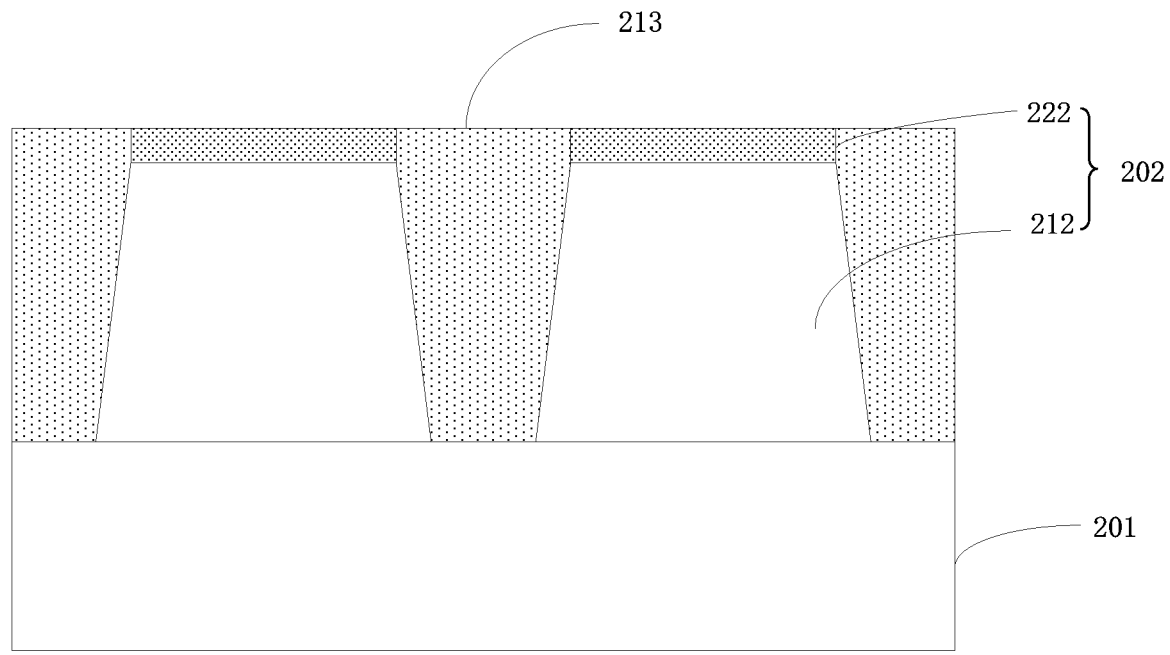
FIG. 17A is a cross-sectional view along a first direction in a phase in forming of a substrate structure.
Figure 17B:
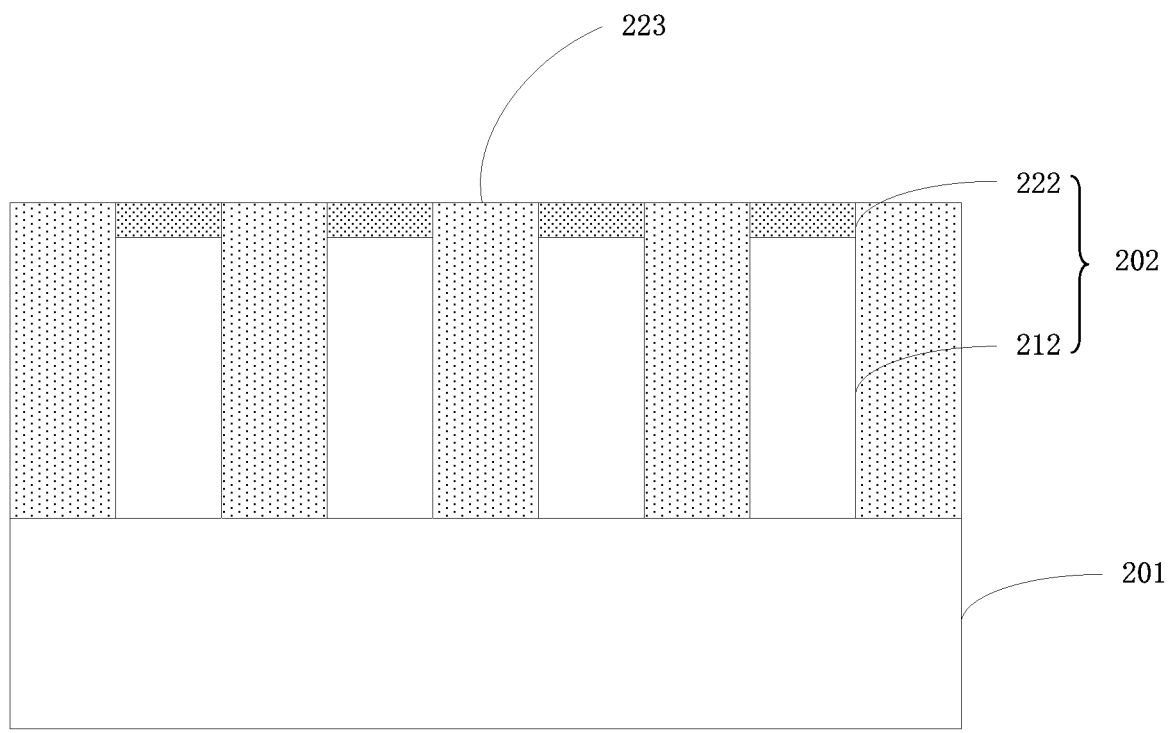
FIG. 17B is a cross-sectional view along a second direction in the phase shown in FIG. 17A.

Then, as shown in FIG. 17A and FIG. 17B, the hard mask 1302 is removed.

Then, second back-etching is performed on the remaining isolation material 1501 to form the substrate structure shown in FIG. 2A and FIG. 2B.

After the substrate structure is formed according to the steps shown in FIG. 13A to FIG. 17B, the subsequent steps 104 to 108 may be performed according to the steps shown in FIG. 1 and the descriptions above.

Above, semiconductor apparatus and manufacturing methods for the same are described in detail. To avoid obstructing the ideas of the present disclosure, some details generally known in the art are not described. According to the foregoing descriptions, a person skilled in the art will understand how to implement the technical solutions disclosed herein. In addition, the embodiments and implementations taught in the disclosure of the specification can be freely combined. A person skilled in the art will understand that the embodiments and implementations described above may be modified without departing from the spirit and scope of the present disclosure as defined by the appended claims.

What is claimed is:

1. A manufacturing method for a semiconductor apparatus, comprising:
   providing a substrate structure, the substrate structure comprising:
   a substrate,
   a fin located on the substrate and extending along a first direction, and
   an isolation region located around the fin, where an upper surface of the isolation region is lower than an upper surface of the fin, the isolation region comprising a first isolation region and a second isolation region, the first isolation region being located on a side surface of the fin that is in the first direction, and the second isolation region being located on a side surface of the fin that is in a second direction that is different from the first direction;
   forming, on the substrate structure, a sacrificial layer;
   etching the sacrificial layer to form an opening, the opening exposing an upper surface of the first isolation region and exposing a part, which is located above the first isolation region, of the side surface of the fin adjacent to the first isolation region;
   filling the opening with an insulating material to form a third isolation region on the first isolation region, an upper surface of the third isolation region being higher than the upper surface of the fin; and
   removing the sacrificial layer.

2. The method according to claim 1, wherein:
   the opening further exposes an end portion of the fin adjacent to the first isolation region, and
   the third isolation region covers the end portion.

3. The method according to claim 1, wherein etching the sacrificial layer to form the opening comprises:
   forming a patterned mask layer above the sacrificial material layer;
   etching the sacrificial material layer using the patterned mask layer as a mask to form a first opening that exposes the upper surface of the first isolation region;
   removing the patterned mask layer; and
   performing wet etching to expand the first opening to be the opening, so that the part, which is located above the first isolation region, of the side surfaces of the fin adjacent to the first isolation region is exposed, wherein the remaining sacrificial material layer is used as the sacrificial layer.

4. The method according to claim 3, wherein forming the sacrificial material layer above the substrate structure comprises:
   forming a protection layer on the substrate structure; and
   forming the sacrificial material layer on the protection layer; and
   wherein the method further comprises:
   removing the protection layer under the sacrificial layer after removing the sacrificial layer.

5. The method according to claim 1, wherein filling the opening with the insulating material comprises:
   after forming the sacrificial layer, forming an insulating material covering the substrate structure, so as to fill the opening; and
   flattening the insulating material using the sacrificial layer as a stop layer, so that an upper surface of the insulating material in the opening is substantially flush with an upper surface of the sacrificial layer.

6. The method according to claim 1, wherein:
the sacrificial layer comprises a silicon nitride, a silicon oxynitride or silicon oxycarbide; and
the insulating material comprises a silicon oxide.

7. The method according to claim 1, wherein the step of providing the substrate structure comprises:
providing an initial substrate;
forming a patterned hard mask on the initial substrate;
etching the initial substrate using the patterned hard mask as a mask, so as to form the substrate and the fin located on the substrate;
depositing an isolation material to fill space around the fin, an upper surface of the isolation material being substantially flush with an upper surface of the patterned hard mask;
performing first back-etching on the isolation material to expose the patterned hard mask;
removing the patterned hard mask; and
performing second back-etching on the remaining isolation material to form the substrate structure.

8. The method according to claim 7, wherein:
the initial substrate comprises an initial semiconductor layer and an initial buffer layer located on the initial semiconductor layer;
the fin comprises a semiconductor layer and a buffer layer located on the semiconductor layer; and
the second back-etching further removes the buffer layer.

9. The method according to claim 1, further comprising:
forming a first gate structure on the fin, and
forming a second gate structure on the third isolation region.

10. The method according to claim 9, further comprising:
etching fins on both sides of the first gate structure using the first gate structure and the second gate structure as masks, to form indentations; and
epitaxially growing a semiconductor material in the indentations to form a source region and a drain region.

11. The method according to claim 9, wherein:
the first gate structure comprises a first gate dielectric layer on the surface of the fin, a first gate on the first gate dielectric layer, a first hard mask layer on the first gate, and a first spacer on side walls of the first gate dielectric layer, the first gate and the first hard mask layer; and
the second gate structure comprises a second gate on the third isolation region, a second hard mask layer on the second gate, and a second spacer on side walls of the second gate and the second hard mask layer, the second spacer covering the end portion of the fin adjacent to the third isolation region.

* * * * *